United States Patent
Park et al.

(10) Patent No.: US 8,193,775 B2
(45) Date of Patent: Jun. 5, 2012

(54) HYSTERESIS SWITCH AND ELECTRICITY CHARGING MODULE USING THE SAME

(75) Inventors: Jun-seok Park, Seoul (KR);
Ha-Ryoung Oh, Goyang-si (KR);
Yeong-Rak Seong, Seoul (KR);
Hyoung-Hwan Roh, Seoul (KR);
Do-won Kim, Suwon-si (KR)

(73) Assignee: Kookmin University Industry Academy Cooperation Foundation (KR)

( * ) Notice: Subject to any disclaimer, the term of this patent is extended or adjusted under 35 U.S.C. 154(b) by 305 days.

(21) Appl. No.: 12/759,213

(22) Filed: Apr. 13, 2010

(65) Prior Publication Data

US 2011/0241624 A1   Oct. 6, 2011

(30) Foreign Application Priority Data

Mar. 31, 2010   (KR) .................. 10-2010-0029107
Mar. 31, 2010   (KR) .................. 10-2010-0029109

(51) Int. Cl.
*H01M 10/46* (2006.01)
(52) U.S. Cl. ..................................... 320/134
(58) Field of Classification Search .......... 320/107, 320/134, 136, 166; 363/56.1, 56.11
See application file for complete search history.

(56) References Cited

U.S. PATENT DOCUMENTS 5,426,349 A * 6/1995 Nilssen ............. 315/219
2006/0239040 A1* 10/2006 Fukumoto ......... 363/21.01

* cited by examiner

*Primary Examiner* — Edward Tso
(74) *Attorney, Agent, or Firm* — Cantor Colburn LLP

(57) ABSTRACT

An electricity charging module using a hysteresis switch includes a storage capacitor that preliminarily stores electrical energy supplied from an external power source, a charging unit for preventing over-charging or over-discharging through monitoring of the charging state of the rechargeable battery, and a hysteresis switch that has a larger turn-on voltage level than the turn-off voltage level, and located between the storage capacitor and the charging unit, thereby electrically connecting or disconnecting the storage capacitor with the charging unit. The hysteresis switch includes a first voltage dividing resistor pair that divides the voltage of an external power source by the resistance ratio of the first voltage dividing resistor pair, a second voltage dividing resistor pair whose one end is connected to a positive electrode terminal of the external power source, a first switching device whose control terminal is connected to the junction of the voltage dividing resistors of the second voltage dividing resistor pair, a second switching device whose control terminal is connected to the junction of the voltage dividing resistors of the first voltage dividing resistor pair, and a resistor that is connected to the junction between the first electrode terminal of the second switching device and the junction of the voltage dividing resistors of the first voltage dividing resistor pair.

11 Claims, 4 Drawing Sheets

HYSTERESIS SWITCH AND ELECTRICITY CHARGING MODULE USING THE SAME

BACKGROUND OF THE INVENTION

1. Field of the Invention

The present invention relates to a hysteresis switch and an electricity charging module using the same, and more particularly, to a hysteresis switch capable of supplying a stable charging power to a rechargeable battery using a simple circuit configuration, and to an electricity charging module using such a hysteresis switch.

2. Description of the Related Art

It is well known that WSN is a wireless sensor network that collects information from various sensors via wireless communication; it is comprised of sensor nodes and sink nodes, wherein the sink node collects information from the sensor nodes and transmits this collected information to the outside. Not like a conventional network, the main purpose of such a wireless sensor network is to provide an automated remote information collection means instead of communication means; as network technologies including wireless personal area network (WPAN) and Ad-hoc network have been developing rapidly, wireless sensor networks are being widely utilized in various applications including scientific, medical, military, and commercial application.

Types of sensors applicable to such wireless sensor networks are temperature sensor, acceleration sensor, position sensor, pressure sensor, fingerprint sensor, gas sensor, etc. Recently, a technology for acquiring logistics information flow by attaching a tag to an object based on radio frequency identification (RFID) technology has been introduced.

Since each sensor node uses independent power supply, i.e. battery, furthermore, rechargeable battery is widely used to extend the battery replacement period or in order not to replace the battery; therefore, energy harvesting technology or energy scavenging technology for charging the rechargeable battery by utilizing the energy emitted from the external energy sources is getting more attention. An external energy source suitable for this purpose can be a sunlight, an indoor illumination light source, RF energy, heat/vibration/kinetic energy of the sensing object or vicinity thereof; more than one external energy source among the above-mentioned external energy sources can be utilized, for example, a sunlight and vibration energy or RF energy. In case of sunlight, the power is supplied as a D.C. current after energy conversion; but in case of vibration energy or RF energy, the energy is converted to a D.C. power followed by rectification before it is supplied as a power.

Since the conventional battery charging module for charging rechargeable battery applies external power directly to the charging unit without using the storage capacitors, it may not sufficiently charge the rechargeable battery due to the lack of the charging current under energy harvesting environment.

Generally, for proper charging, the external charging voltage for a battery charging module should be about 10 to 20% greater than the nominal voltage of the rechargeable battery. Furthermore, if the supply voltage of an external power source fluctuates around the turn-on voltage level due to the noises or the environmental conditions, the switches will frequently be turned on and off resulting in unstable supply of the charging voltage for the battery, thereby degrading the charging efficiency and shortening the battery life.

BRIEF SUMMARY OF THE INVENTION

The objective of this invention, to solve above-described problems, is to provide a hysteresis switch capable of supplying a stable charging power to a rechargeable battery using a simple circuit configuration.

Another objective of this invention is to provide an electricity charging module using such a hysteresis switch.

A hysteresis switch in accordance with an exemplary embodiment of the present invention is comprised of: a first voltage dividing resistor pair (R1, R2) that divides the voltage of an external power source by the resistance ratio of the first voltage dividing resistor pair; a second voltage dividing resistor pair (R3, R4) whose one end is connected to a positive electrode terminal of the external power source; a first switching device whose control terminal is connected to the junction of the voltage dividing resistors of the second voltage dividing resistor pair (R3, R4), a first electrode terminal is connected to the output terminal, and a second electrode terminal is connected to the positive electrode terminal; a second switching device whose control terminal is connected to the junction of the voltage dividing resistors of the first voltage dividing resistor pair (R1, R2), a first electrode terminal is connected to the other end of the second voltage dividing resistor pair (R3, R4), and a second electrode terminal is connected to ground; and a resistor (R5) that is connected to the junction between the first electrode terminal of the second switching device and the junction of the voltage dividing resistors of the first voltage dividing resistor pair (R1, R2).

In the above-described configuration, the first switching device and the second switching device may be comprised of a p-channel FET and an n-channel FET respectively.

The first switching device and the second switching device may be comprised of a pnp-type BJT and an npn-type BJT respectively.

The first switching device and the second switching devices may be comprised of a p-channel high electron mobility transistor (hereinafter refer to as "HEMT") and an n-channel HEMT respectively, wherein one source terminal of each HEMT is floated.

An electricity charging module using a hysteresis switch in accordance with another exemplary embodiment of the present invention is comprised of: a storage capacitor that preliminarily stores electrical energy supplied from an external power source; a charging unit for preventing over-charging or over-discharging through monitoring of the charging state of the rechargeable battery; and a hysteresis switch that has a larger turn-on voltage level than the turn-off voltage level, and located between the storage capacitor and the charging unit, thereby electrically connecting or disconnecting the storage capacitor with the charging unit.

In the above-described configuration, the electricity charging module further be comprised of a rectifying unit in front of the storage capacitor for rectification of an A.C. component of an external power source if the external power source includes the A.C. component.

Meanwhile, in the above-described electricity charging module, the hysteresis switch is comprised of: a first voltage dividing resistor pair (R1, R2) that divides the voltage of an external power source by the resistance ratio of the first voltage dividing resistor pair; a second voltage dividing resistor pair (R3, R4) whose one end is connected to a positive electrode terminal of the external power source; a first switching device whose control terminal is connected to the junction of the voltage dividing resistors of the second voltage dividing resistor pair (R3, R4), the first electrode terminal of the first switching device is connected to the output terminal, and the second electrode terminal of the first switching device is connected to the positive electrode terminal of the storage capacitor; a second switching device whose control terminal is connected to the junction of the voltage dividing resistors of the first voltage dividing resistor pair (R1, R2), the first electrode terminal of the second switching device is connected to the other end of the second voltage dividing resistor pair (R3, R4), and the second electrode terminal of the second switching device is connected to ground; and a resistor (R5) that is connected to the junction between the first electrode terminal of the second switching device and the junction of the voltage dividing resistors of the first voltage dividing resistor pair (R1, R2).

The above-described first switching device and second switching device may further comprise a p-channel FET and an n-channel FET, a p-type BJT and an n-type BJT, or a p-channel HEMT and an n-channel HEMT respectively.

A reverse current protection diode is connected between the rectifying unit and the storage capacitor.

According to a hysteresis switch and an electricity charging module using the same, the necessary charging current can be stably supplied to the rechargeable battery because the electrical energy in the storage capacitor is applied to the charging unit after storing enough electrical energy in the storage capacitor.

Since the electricity charging module of the present invention adopts electronic switches having larger hysteresis characteristics that has a higher turn-on voltage level than the turn-off voltage level, a stable charging voltage can be applied to the rechargeable battery, thereby charger module works properly and life of the rechargeable battery under energy harvesting environment can be extended.

In addition, the power consumption can be reduced by reducing the leakage current when a FET or a HEMT are used as a switching device.

DETAILED DESCRIPTION OF THE INVENTION

Hereinafter, a preferred exemplary embodiment of a hysteresis switch and an electricity charging module using the same will be described in detail with reference to the attached drawings.

Figure 1:
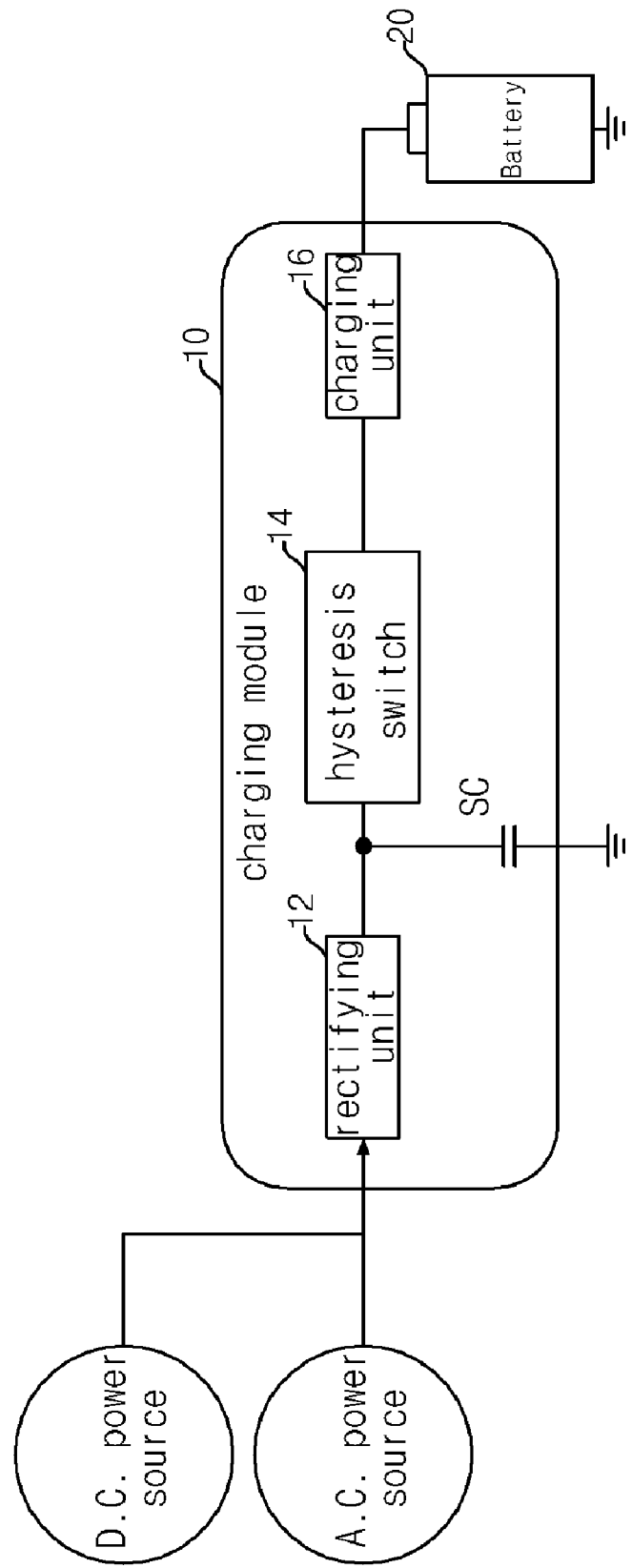
FIG. 1 is an electrical block diagram of an electricity charging module for a rechargeable battery adopting an electronic switch having hysteresis characteristics in accordance with the present invention.

FIG. 1 is an electrical block diagram of an electricity charging module for a rechargeable battery adopting an electronic switch having hysteresis characteristics in accordance with the present invention. As illustrated in FIG. 1, an electronic switch having hysteresis characteristics 14 (hereinafter referred to as "hysteresis switch") can be adopted by an electricity charging module 10 for charging a rechargeable battery 20; as an external power source for such electricity charging module 10, a D.C. power or an A.C. power can be applied.

An electricity charging module 10 can be comprised of: a rectifying unit 12 for rectification of an external power input when it is an A.C. power; a storage capacitor (SC) for preliminarily storing of an electrical energy from an external power source that is either rectified by the rectifying unit 12 or received directly from an external D.C. power source; a charging unit 16 for performing an over-charging prevention function, an over-discharging prevention function or etc. through monitoring of the charging state of the rechargeable battery 20; and a hysteresis switch 14 that electrically connects the storage capacitor (SC) with the charging unit 16 by turning-on when the voltage of the energy in the storage capacitor (SC) is higher than the critical value, i.e. turn-on voltage level (Von), and electrically disconnects the storage capacitor (SC) with the charging unit 16 by turning-off when the voltage of the energy in the storage capacitor (SC) is lower than the critical value, i.e. turn-off voltage level (Voff) that is set at the lower value than the turn-on voltage level (Von).

In the above-described configuration, the rectifying unit 12 can be selectively utilized when an A.C. component exists in the external power source, in other words, a half-wave rectifying circuit or full-wave rectifying circuit can be selectively used depending on the voltage requirement of the rechargeable capacitor 20 and the voltage level of the external power source. A reverse current protection diode can additionally connected between the rectifying unit 12 and the storage capacitor (SC) to prevent reverse current flow from the storage capacitor (SC) to the rectifying unit 12.

Continuous supplying of necessary power to the rechargeable battery 20 is difficult in an energy harvesting environment where energy is obtained from the vicinity of the sensing object like a sensor node; moreover, charging is impossible if the charging voltage is lower than the nominal voltage of the rechargeable battery as described above; considering above-mentioned problems, an electrical energy collected from the external power sources is preliminarily stored in the storage capacitor (SC) that is inserted after the rectifying unit 12. In here, various types of capacitor such as ceramic capacitor, mylar capacitor, electrolytic capacitor, and super capacitor can be selectively used as a storage capacitor (SC), wherein the super capacitor is a capacitor having an extraordinary large capacitance value compare to a common capacitor. According to the capacitance range, types of the capacitors are classified as low-capacity type, medium-capacity type, and high-capacity type; the applications of the super capacitors differ depending on the type. The capacity of the storage capacitor (SC) of the electricity charging module 10 of the present invention can be selected properly depending on the system in which the electricity charging module 10 is to be applied.

Figure 2:
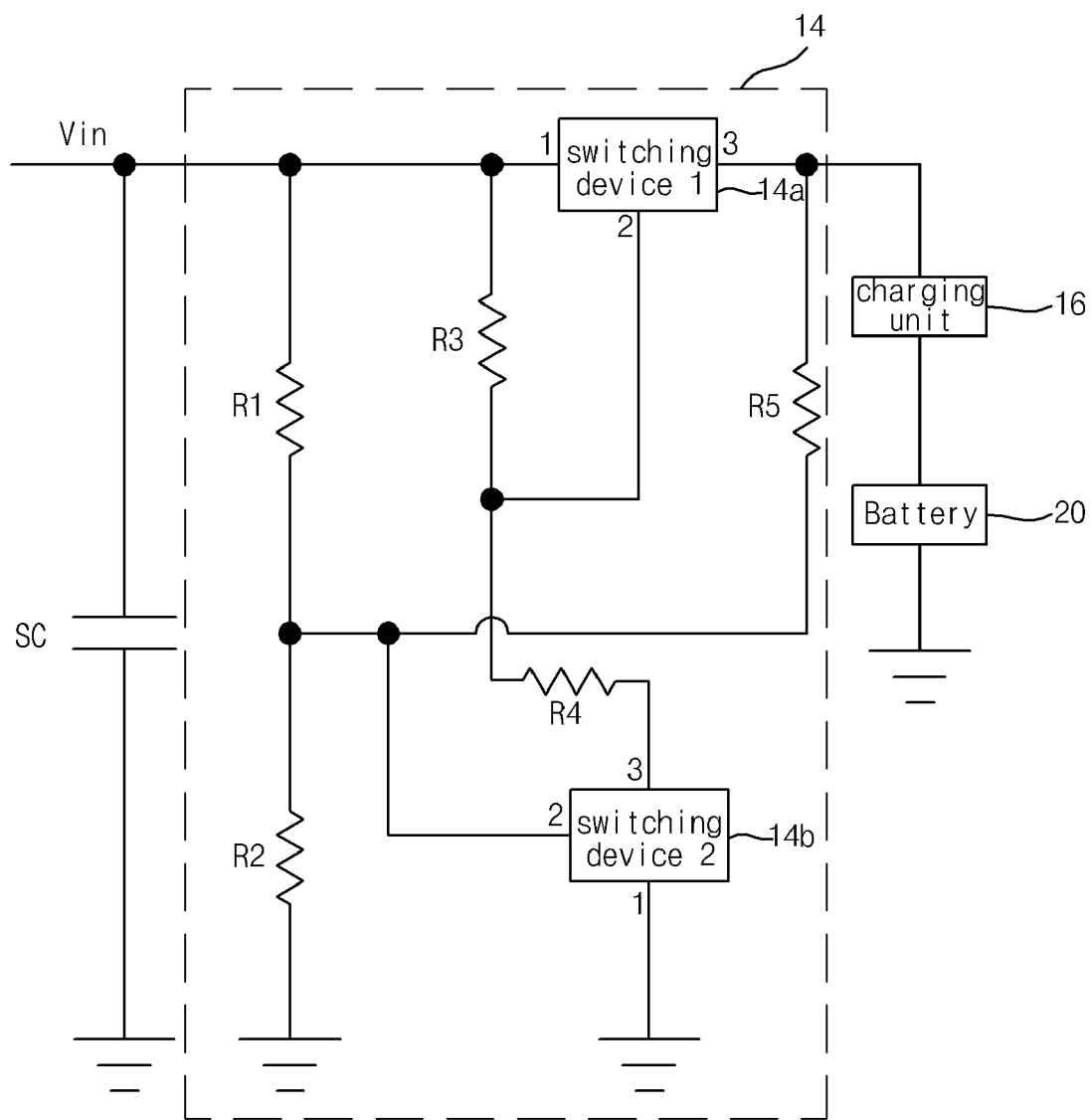
FIG. 2 is a conceptional circuit diagram of an electronic switch, in an electricity charging module, having hysteresis characteristics in accordance with the present invention.

FIG. 2 is a conceptional circuit diagram of an electronic switch, in an electricity charging module, having hysteresis characteristics in accordance with the present invention. As shown in FIG. 2, the hysteresis switch 14 of the present invention is comprised of: a first voltage dividing resistor pair (R1, R2) that divides the voltage of an external power source by the resistance ratio of the first voltage dividing resistor pair whose ends are connected to the ends of the grounded storage capacitor (SC) respectively, a second voltage dividing resistor pair (R3, R4) whose one end is connected to a positive electrode terminal of the storage capacitor (SC); a first switching device 14a whose control terminal 2 is connected to the junction of the voltage dividing resistors of the second voltage dividing resistor pair (R3, R4), the first electrode terminal 3 is connected to the output terminal, and the second terminal 1 is connected to the positive electrode terminal of the storage capacitor (SC); a second switching device 14b whose control terminal 2 is connected to the junction of the voltage dividing resistors of the first voltage dividing resistor pair (R1, R2), the first electrode terminal 3 is connected to the other end of the second voltage dividing resistor pair (R3, R4), and the second terminal 1 is connected to ground; and a resistor (R5) that is connected to the junction where the first electrode terminal 3 of the second switching device 14b and the junction of the voltage dividing resistors of the first voltage dividing resistor pair (R1, R2).

Figure 3:
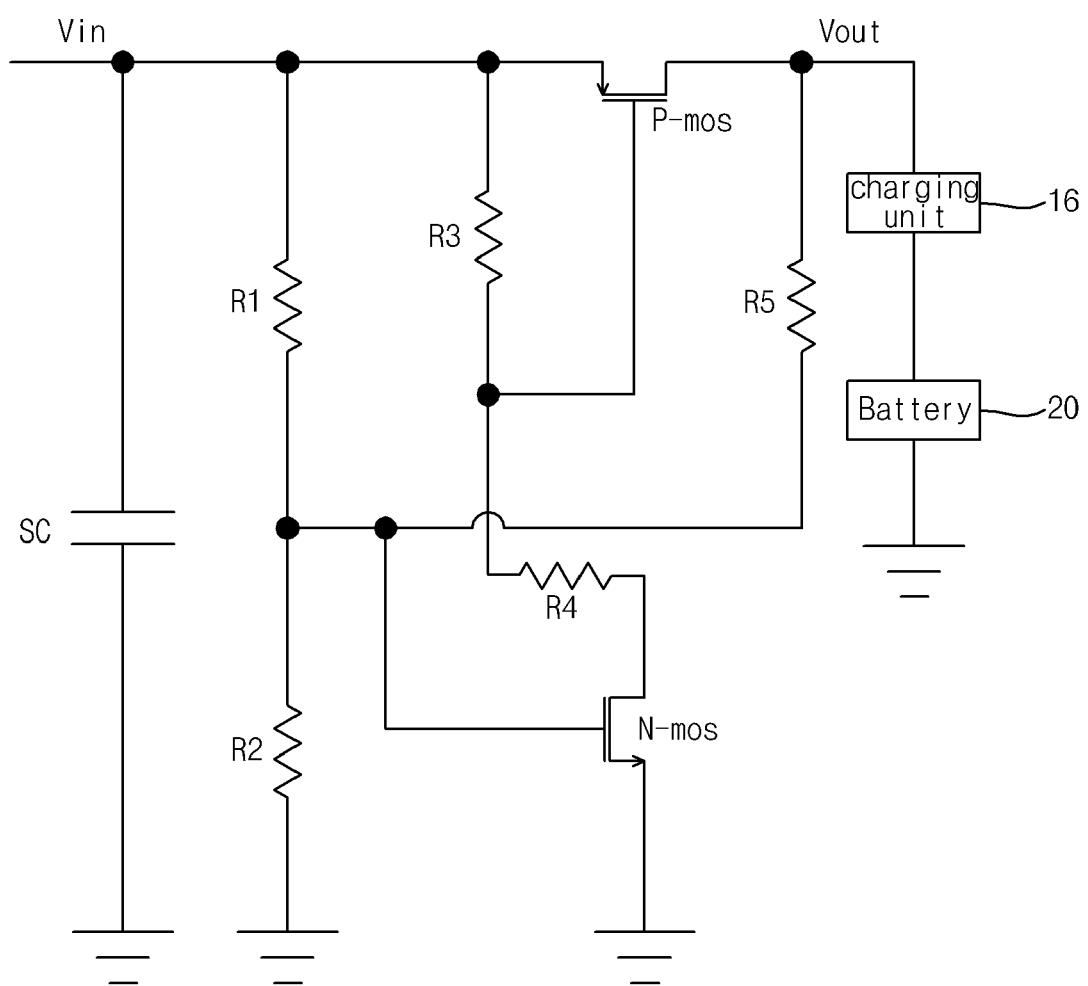
FIG. 3 is a detailed circuit diagram of an electronic switch, in an electricity charging module, having hysteresis characteristics in accordance with an exemplary embodiment of the present invention.

FIG. 3 is a detailed circuit diagram of an electronic switch, in an electricity charging module, having hysteresis characteristics of the present invention, wherein an exemplary embodiment is illustrated where a p-channel FET(p-MOS) and an n-channel FET(n-MOS) are used as the first switching device 14a and the second switching device 14b respectively. In this configuration, the control terminals 2 of the first switching device 14a and the second switching device 14b correspond to the gate terminals, the first electrode terminals 3 correspond to the drain terminals, and the second electrodes 1 correspond to the source terminals.

Figure 4:
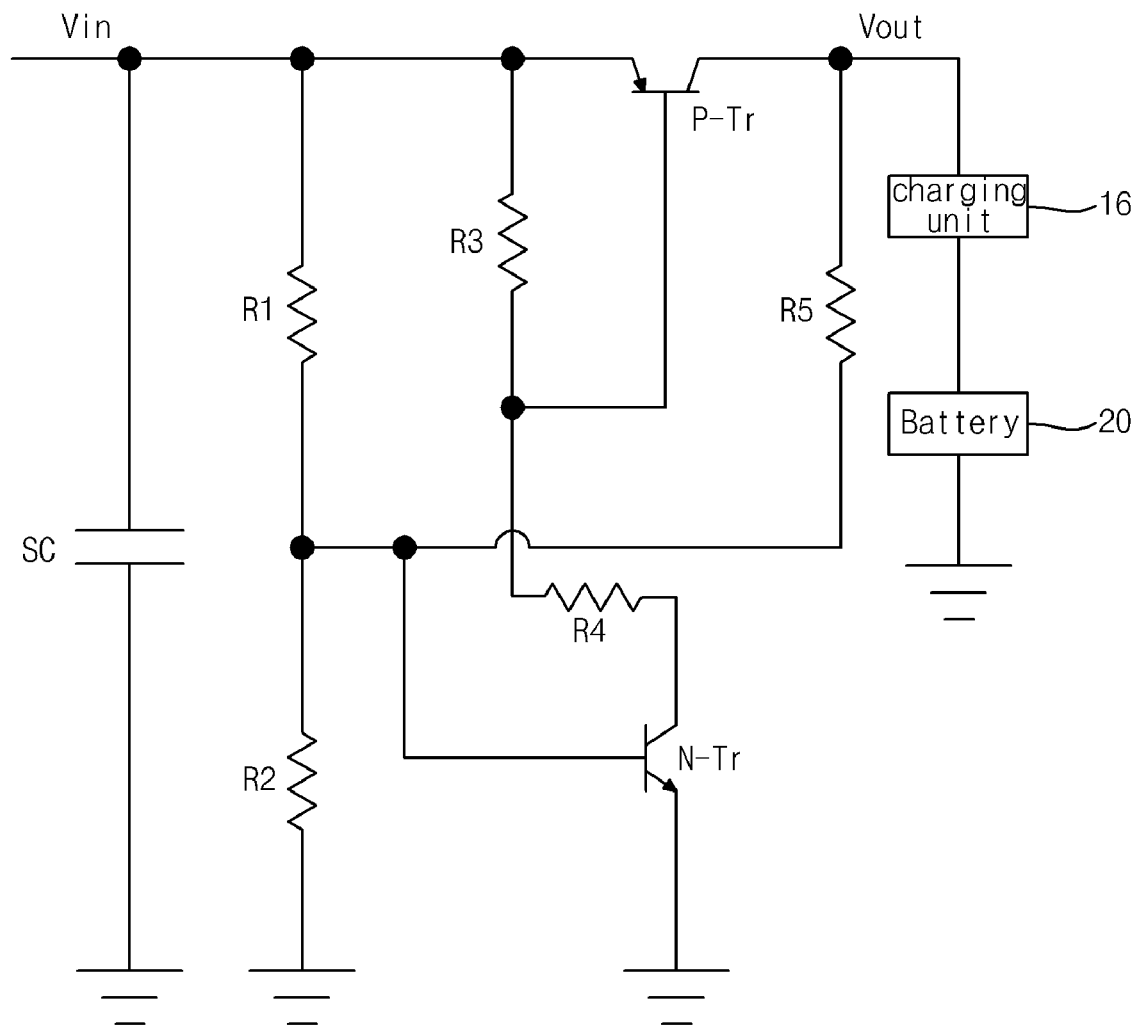
FIG. 4 is a detailed circuit diagram of an electronic switch, in an electricity charging module, having hysteresis characteristics in accordance with another exemplary embodiment of the present invention.

FIG. 4 is a detailed circuit diagram of an electronic switch, in an electricity charging module, having hysteresis characteristics of the present invention, wherein another exemplary embodiment is illustrated where a p-channel BJT (p-type transistor) and an n-channel BJT (n-type transistor) are used as a first switching device 14a and a second switching device 14b respectively. In this configuration, the control terminals 2 of the first switching device 14a and the second switching device 14b correspond to the base terminals, the first electrode terminals 3 correspond to the collector terminals, and the second electrodes 1 correspond to the emitter terminals.

In the above-describe configuration, when the voltage of the storage capacitor SC is higher than the turn-on voltage level of the hysteresis switch 14, the n-channel FET (or n-type BJT) is being turned on due to the voltage $$\frac{V_{on} * R2}{(R1 + R2)}$$

divided by the first voltage dividing resistor pair (R1, R2) and applied to the gate (or base) of the n-channel FET (or npn-type BJT); at this time, the voltage at the gate terminal (or base terminal) of the p-channel FET (or pnp-type BJT) is being lowered. Consequently, the voltage difference between the gate terminal (or base terminal) and the source terminal (or emitter terminal) of the p-channel FET (or pnp-type BJT) increases above the turn-on voltage level, thereby the p-channel FET (or pnp-type BJT) is turned on, and the charging voltage of the storage capacitor (SC) is applied to the charging unit 16. When the p-channel FET (or pnp-type BJT) is turned on, the upper resistor (R1) of the first voltage dividing resistor pair (R1, R2) and the resistor (R5) are being connected forming a parallel resistor pair having effective resistance value of $$\frac{R1 * R5}{R1 + R5}$$

that is lower than the resistor (R1); since this parallel resistor pair is connected in series with the bottom resistor R2 of the first voltage dividing resistor pair (R1, R2), the voltage being applied to the gate terminal (or base terminal) of the n-channel FET (or npn-type BJT) is increased. As a result, even the voltage of the storage capacitor (SC) is equal or less than the turn-on voltage level (Von), the hysteresis switch 14 maintains turn-on state as long as the voltage of the storage capacitor (SC) stays above the turn-off voltage level (Voff). In conclusion, the turn-on voltage level (Von) and the turn-off voltage level (V off) of the hysteresis switch 14 can be set at any desirable value by adjusting the resistance values of the first resistor pair (R1, R2) and the resistor (R5).

Although not shown here, a high electron mobility transistor (HEMT) can be adopted as a first switching device 14a or a second switching device 14b; such HEMTs are similar to FETs in device operation except that HEMT has two source terminals while FET has one. When HEMTs are used as a first switching device 14a or a second switching device 14b, one source terminal of each HEMT is being floated.

When a FET or a HEMT is used as a first switching device 14a or a second switching device 14b, the leakage current can be reduced more effectively since these transistors are voltage controlled devices compare to BJTs, therefore, leakage power consumption can be reduced. The electronic switches of the present invention having hysteresis characteristics can be used in the low power driving systems, the battery-free sensor nodes, etc.

The hysteresis switch and an electricity charging module of the present invention is not limited to the above-described exemplary embodiments, but various changes and modifications may be made without departing from the scope and spirit of the present invention as disclosed in the accompanying claims.

What is claimed is:

1. A switch having a hysteresis characteristic comprising:
a first voltage dividing resistor pair (R1, R2) that divides the voltage of an external power source by the resistance ratio of the first voltage dividing resistor pair;
a second voltage dividing resistor pair (R3, R4) whose one end is connected to a positive electrode terminal of the external power source;
a first switching device whose control terminal is connected to the junction of the voltage dividing resistors of the second voltage dividing resistor pair (R3, R4), wherein a first electrode terminal of the first switching device is connected to the output terminal, and a second electrode terminal of the first switching device is connected to the positive electrode terminal;
a second switching device whose control terminal is connected to the junction of the voltage dividing resistors of the first voltage dividing resistor pair (R1, R2), wherein a first electrode terminal of the second switching device is connected to the other end of the second voltage dividing resistor pair (R3, R4), and a second electrode terminal of the second switching device is connected to ground; and
a resistor (R5) that is connected to the junction between the first electrode terminal of the second switching device and the junction of the voltage dividing resistors of the first voltage dividing resistor pair (R1, R2).

2. The switch having a hysteresis characteristic according to claim 1, wherein the first switching device and the second switching device are comprised of a p-channel FET and an n-channel FET respectively.

3. The switch having a hysteresis characteristic according to claim 1, wherein the first switching device and the second switching device are comprised of a pnp-type BJT and an npn-type BJT respectively.

4. The switch having a hysteresis characteristic according to claim 1, wherein the first switching device and the second switching device are comprised a p-channel HEMT and an n-channel HEMT respectively, and wherein one source terminal of each HEMT is floated.

5. An electricity charging module using a storage capacitor comprising:

a storage capacitor that preliminarily stores electrical energy supplied from an external power source;

a charging unit for preventing over-charging and optionally over-discharging through monitoring of the charging state of the rechargeable battery; and a hysteresis switch that has a larger turn-on voltage level than the turn-off voltage level, and located between the storage capacitor and the charging unit, thereby electrically connecting or disconnecting the storage capacitor with the charging unit.

6. The electricity charging module using a storage capacitor according to claim 5, further comprising a rectifying unit in front of the storage capacitor for rectification of an A.C. component of an external power source if the external power source includes the A.C. component.

7. The electricity charging module using a storage capacitor according to claim 5, wherein the hysteresis switch comprises:

a first voltage dividing resistor pair (R1, R2) that divides the voltage of an external power source by the resistance ratio of the first voltage dividing resistor pair;

a second voltage dividing resistor pair (R3, R4) whose one end is connected to a positive electrode terminal of the external power source;

a first switching device whose control terminal is connected to the junction of the voltage dividing resistors of the second voltage dividing resistor pair (R3, R4), wherein the first electrode terminal of the first switching device is connected to the output terminal, and the second electrode terminal of the first switching device is connected to the positive electrode terminal of the storage capacitor;

a second switching device whose control terminal is connected to the junction of the voltage dividing resistors of the first voltage dividing resistor pair (R1, R2), wherein the first electrode terminal of the second switching device is connected to the other end of the second voltage dividing resistor pair (R3, R4), and the second electrode terminal of the second switching device is connected to ground; and a resistor (R5) that is connected to the junction between the first electrode terminal of the second switching device and the junction of the voltage dividing resistors of the first voltage dividing resistor pair (R1, R2).

8. The electricity charging module using a storage capacitor according to claim 7, wherein the first switching device and second switching device comprise a p-channel FET and an n-channel FET respectively.

9. The electricity charging module using a storage capacitor according to claim 7, wherein the first switching device and second switching device comprise a pnp-type BJT and an npn-type BJT respectively.

10. The electricity charging module using a storage capacitor according to claim 7, wherein the first switching device and second switching device comprise a p-channel HEMT and an n-channel HEMT respectively, and wherein one source terminal of each HEMT is floated.

11. The electricity charging module using a storage capacitor according to claim 6, wherein a reverse current protection diode is connected between the rectifying unit and the storage capacitor.

* * * * *